United States Patent
Kittl et al.

(10) Patent No.: US 9,847,245 B1
(45) Date of Patent: Dec. 19, 2017

(54) FILLING PROCESSES

(71) Applicant: Samsung Electronics Co., Ltd., Suwon-si, Gyeonggi-do (KR)

(72) Inventors: Jorge A. Kittl, Austin, TX (US); Kyungseok Oh, Seoul (KR); Sung Min Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/343,151

(22) Filed: Nov. 3, 2016

Related U.S. Application Data

(60) Provisional application No. 62/351,249, filed on Jun. 16, 2016.

(51) Int. Cl.
*H01L 21/762* (2006.01)
*H01L 21/306* (2006.01)
*H01L 21/324* (2006.01)

(52) U.S. Cl.
CPC .. *H01L 21/76205* (2013.01); *H01L 21/30604* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 6,566,229 B2 | 5/2003 | Hong et al. | |
| 7,226,873 B2 * | 6/2007 | Yen | H01L 21/312 257/E21.026 |
| 7,557,420 B2 | 7/2009 | Fucsko et al. | |
| 8,148,267 B2 | 4/2012 | Cho et al. | |
| 8,242,004 B2 | 8/2012 | Miyahara | |
| 8,242,574 B2 | 8/2012 | Lee | |
| 8,466,067 B2 | 6/2013 | Liang et al. | |
| 8,575,716 B2 | 11/2013 | Mathew et al. | |
| 8,580,649 B2 | 11/2013 | Miyahara et al. | |
| 9,209,243 B2 | 12/2015 | Chuang et al. | |
| 9,257,302 B1 | 2/2016 | Wang et al. | |
| 2002/0072198 A1 * | 6/2002 | Ahn | H01L 21/76224 438/424 |
| 2002/0127817 A1 * | 9/2002 | Heo | H01L 21/76224 438/424 |
| 2004/0173812 A1 * | 9/2004 | Currie | H01L 21/76224 257/103 |
| 2006/0110941 A1 * | 5/2006 | Yen | H01L 21/312 438/781 |
| 2006/0281336 A1 * | 12/2006 | Arisumi | H01L 21/312 438/787 |
| 2007/0207590 A1 | 9/2007 | Kiyotoshi et al. | |

(Continued)

*Primary Examiner* — Allan Olsen
(74) *Attorney, Agent, or Firm* — Lewis Roca Rothgerber Christie LLP

(57) ABSTRACT

A method of filling cavities in a semiconductor structure during fabrication. A layer of a first material, e.g., a polysilazane, is deposited on the semiconductor, and subjected to a first thermal process to change its chemical composition, e.g., to change it to silicon dioxide. It is then etched back, and the cycle of deposition, and thermal processing is repeated. The etch-back may also be repeated in one or more of the cycles after the first cycle, and a second thermal process, that may increase the density of one or more of the deposited layers, may be performed in one or more of the cycles.

20 Claims, 31 Drawing Sheets

(56) References Cited

U.S. PATENT DOCUMENTS

2009/0137094 A1* 5/2009 Lee .................. H01L 21/76224
  438/424
2012/0178265 A1 7/2012 Miyahara
2012/0208346 A1* 8/2012 Kadoshima ....... H01L 21/76229
  438/425
2013/0214383 A1* 8/2013 Nakamoto ........ H01L 21/02126
  257/506

* cited by examiner

FILLING PROCESSES

CROSS-REFERENCE TO RELATED APPLICATION(S)

The present application claims priority to and the benefit of U.S. Provisional Application No. 62/351,249, filed Jun. 16, 2016, entitled "FILLING PROCESSES", the entire content of which is incorporated herein by reference.

FIELD

One or more aspects of embodiments according to the present invention relate to fabrication processes for semiconductor structures, and more particularly to a method, within such processes, for filling gaps or voids.

BACKGROUND

With scaling both in memory and complementary metal oxide (CMOS) logic fabrication, a method for achieving void free and pinhole free fillings of narrow cavities, trenches, gaps, etc. which may have high aspect ratios, may be desired. For example, void free and pinhole free fillings of shallow trench isolation structures, that have lateral dimensions below 40 nm, with an adequate dielectric, may be used in some integrated circuits.

Thus, there is a need for a method for forming fillings in integrated circuits.

SUMMARY

Aspects of embodiments of the present disclosure are directed toward a method of filling cavities in a semiconductor structure during fabrication. A layer of a first material, e.g., a polysilazane, is deposited on the semiconductor, and subjected to a first thermal process to change its chemical composition, e.g., to change it to silicon oxide (e.g., silicon dioxide, or silicon monoxide, or silicon trioxide). It is then etched back, and the cycle of deposition, and thermal processing is repeated. The etch-back may also be repeated in one or more of the cycles after the first cycle, and a second thermal process, that may increase the density of one or more of the deposited layers, may be performed in one or more of the cycles.

According to an embodiment of the present invention there is provided a method for filling a cavity in a semiconductor structure, the method including: forming a first layer of a first material in the cavity; subjecting the semiconductor structure to a first thermal process including subjecting the semiconductor structure to a temperature of at least 100° C. for interval of time; etching back the first layer to form a reduced first layer, having a reduced thickness; forming a second layer of a second material, in the cavity; and subjecting the semiconductor structure to a second thermal process including subjecting the semiconductor structure to a temperature of at least 100° C. for interval of time, to form, from at least the reduced first layer and the second layer, a single layer of uniform composition and density.

In one embodiment, the second material is the same as the first material.

In one embodiment, the first material is a polysilazane.

In one embodiment, the forming of the second layer of the second material is performed by substantially the same process as the forming of the first layer of the first material, and wherein the second thermal process is substantially the same as the first thermal process.

In one embodiment, the forming of the second layer of the second material, in the cavity, includes forming the second layer directly on the reduced first layer.

In one embodiment, the method includes: performing a third thermal process after performing the second thermal process, the third thermal process increasing the density of the single layer by at least about 20%.

In one embodiment, the forming of the first layer includes forming the first layer by a spin-on deposition, and/or the forming of the second layer includes forming the second layer by a spin-on deposition.

In one embodiment, the single layer substantially fills the cavity.

In one embodiment, the first material and/or the second material includes, as a major component, an inorganic polysilazane.

In one embodiment, the first material includes, as a major component, an inorganic polysilazane, and, after the subjecting of the semiconductor structure to the first thermal process, the first layer includes, as a major component, silicon dioxide, and/or the second material includes, as a major component, an inorganic polysilazane, and, after the subjecting of the semiconductor structure to the second thermal process, the second layer includes, as a major component, silicon dioxide.

In one embodiment, the subjecting of the semiconductor structure to the first thermal process includes subjecting the semiconductor structure to the first thermal process in a wet oxidation environment, and/or the subjecting of the semiconductor structure to the second thermal process includes subjecting the semiconductor structure to the second thermal process in a wet oxidation environment.

In one embodiment, the first thermal process includes subjecting the semiconductor structure to a temperature between 100° C. and 250° C. for an interval of time, and the second thermal process includes subjecting the semiconductor structure to a temperature between 500° C. and 850° C. for an interval of time.

In one embodiment, the cavity is a trench for a shallow trench isolation (STI) structure.

In one embodiment, the single layer includes, as a major component, an oxide.

In one embodiment, a width of the cavity is less than 40 nm.

In one embodiment, a width of the cavity is less than 20 nm.

In one embodiment, the method includes: etching back the single layer to form a reduced single layer, having a reduced thickness, wherein a thickness of the reduced first layer is greater than 5 nm and less than 50 nm, and a thickness of the reduced single layer is greater than 10 nm and less than 100 nm.

According to an embodiment of the present invention there is provided a method for filling a cavity in a semiconductor structure, the method including: forming a first layer of a first material in the cavity; subjecting the semiconductor structure to a first thermal process including subjecting the semiconductor structure to a temperature of at least 100° C. for interval of time, to form, from the first layer, a second layer of a second material having a chemical composition different from that of the first material; etching back the second layer to form a reduced second layer, having a reduced thickness; forming a third layer of a third material, in the cavity; and subjecting the semiconductor structure to a second thermal process including subjecting the semiconductor structure to a temperature of at least 100° C. for interval of time, to form from at least the reduced second layer and the third layer, a single layer of uniform composition and density.

In one embodiment, the second thermal process increases the density of the second material by at least about 20%.

According to an embodiment of the present invention there is provided a method for filling a cavity in a semiconductor structure, the method including: forming a first layer of a first material in the cavity; subjecting the semiconductor structure to a first thermal process including subjecting the semiconductor structure to a temperature of at least 100° C. for interval of time, to form, from the first layer, a second layer of a second material having a chemical composition different from that of the first material; etching back the second layer to form a reduced second layer, having a reduced thickness; forming a third layer of the first material, in the cavity; and subjecting the semiconductor structure to a second thermal process including an subjecting the semiconductor structure to a temperature of at least 100° C. for interval of time, to form from at least the reduced second layer and the third layer, a single layer, of uniform composition and density, of the second material.

BRIEF DESCRIPTION OF THE DRAWINGS

These and other features and advantages of the present invention will be appreciated and understood with reference to the specification, claims, and appended drawings wherein:

FIGS. 1A-1I are schematic cross sectional views of an intermediate structure during the fabrication of an integrated circuit according to an embodiment of the present invention;

DETAILED DESCRIPTION

Figure 1A:
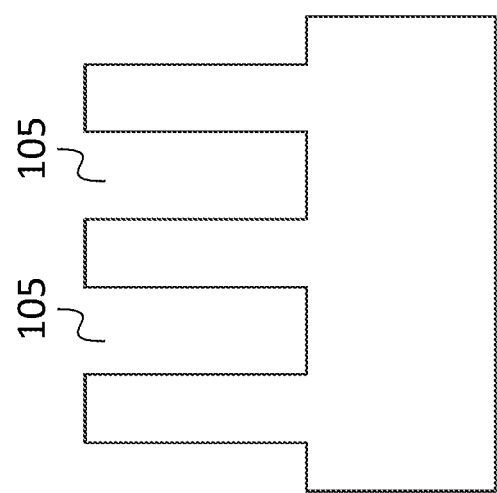

The detailed description set forth below in connection with the appended drawings is intended as a description of exemplary embodiments of an improved method for filling provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Embodiments of the present invention may be employed to fill narrow trenches, holes or gap structures (having, e.g., lateral dimensions of about 50 nm or less) that may have high aspect ratios, with a significant reduction of void and pinhole issues (e.g., a significant reduction, compared to related art methods, in the number of voids and pinholes in the filled region). The filling method may include repeated iterations of a cycle that may include a deposition, a first anneal step, an etch-back step, and a second anneal step. In some embodiments, the second anneal step may be omitted in some or all of the cycles. The last cycle may include only some of the steps (i.e., it may be a "partial" cycle rather than a complete cycle).

The different cycles may also include some variation of the parameters of each step from cycle to cycle (e.g., the deposition thickness, the anneal conditions, or the thickness etched back). In some embodiments, there are a minimum of two full cycles and one final cycle (which may be partial or full), the final cycle including at least deposition and anneal steps. In some embodiments, there are a minimum of one full cycle and one final cycle (which may be partial or full), the final cycle including at least deposition and anneal steps. In one embodiment, the deposition is achieved by a spin-on coating. In some embodiments, the method is applied to the filling of shallow trench isolation trenches. In some embodiments, the method is applied to the filling of shallow trench isolation trenches and the deposition is achieved by a spin-on coating. In one embodiment, the method is applied to the filling of shallow trench isolation trenches and the deposition is achieved by a spin-on coating of a polysilazane material. In some embodiments SiO2 (or "$SiO_2$") fillings of narrow trenches (e.g., having dimensions of less than 40 nm) is accomplished using polysilazane-based spin-on coatings. As used herein, "narrow lateral dimensions" refers to lateral dimensions of about 50 nm or less.

Embodiments of the present invention may be applied in a fabrication flow for nano-scale devices such as in memory or logic CMOS flows. The method may be applied to the filling of narrow trench, hole or gap structures, for which accomplishing the filling without voids or pinholes may be challenging. Some embodiments may result in fewer voids compared to related art methods, for the same structures. Some embodiments may be employed to fill trenches or holes having widths in the range of 5 nm to 50 nm.

Once narrow trenches, holes or gaps have been fabricated and are ready for the filling process (as in related art flows), the filling process in some embodiments includes (e.g., consists of) (i) the iteration of at least one cycle consisting of the sequence of a deposition step, a first annealing step, an etch-back step, and an optional second annealing step, and (ii) a final cycle that includes at least a deposition step and an annealing step, to accomplish the filling.

Each of the annealing steps may include a thermal process that may have a temperature profile involving several different ramps and soak temperatures, and that may involve several different ambients, and that may include the use of more than one chamber or tool to complete. As used herein, a "temperature profile" is a mapping from time to temperature, i.e., a prescription of the temperature, as a function of time, in a thermal process.

The conditions and parameters of the different steps in each cycle can be preserved to be substantially the same through the iteration of cycles, or may be varied from cycle to cycle, so that they are different for different cycles in the sequence. In some embodiments, the depositions are achieved by spin-on coatings.

In one embodiment the method is used, e.g., as part of the fabrication flow of fin field effect transistor (finFET) devices, to fill narrow trenches or holes, such as the trenches for forming shallow-trench isolation (STI) structures, using at the deposition steps the spin-on coating of an inorganic-polysilazane. Polysilazanes are polymers containing silicon (Si), nitrogen (N) and hydrogen (H); they may be represented by the notation $[R1R2Si-NR3]_n$. Curing and oxidation of polysilazanes may result in good quality silicon dioxide (SiO2) films. During low temperature curing and wet oxidation to form SiO2, byproducts (such as ammonia (NH3), hydrogen (H2), and water (H2O)) are released and/or outgassed from the film and the film density increases; during this process, the film may shrink.

In the related art, for example, the inorganic polysilazane may be applied as a spin-on coating, and followed by thermal cycles in wet and/or dry oxidation environments, in order to transform the structure to become substantially SiO2. This is accompanied by the release of byproducts which are outgassed from the film, and by densification of the film. Both processes (outgassing and densification) may lead to void or pinhole formation. In related art processes, it may be difficult to achieve void-free fillings for trenches with widths of about 20 nm or less. The outgassing of byproducts and densification of the film during thermal processes may lead to voids. This problem is exacerbated at small trench widths particularly for large aspect ratio trenches, and can also be exacerbated by defects on the surfaces of the trenches or non-uniformities of the trench geometries, which may promote the local formation of voids. Embodiments of the present invention include methods for filling that are less prone to the formation of voids.

As used herein, a "thermal process" is a process including an interval of time in which the structure being fabricated is maintained at an elevated temperature (i.e., a temperature of at least 100° C.). The thermal process may involve several different temperature ramps and soak temperatures and several different ambients, and may include the use of more than one chamber or tool to complete. As examples, ambients may include wet oxidation or dry oxidation environments. A thermal process does not include deposition or etching steps. As used herein, "anneal" is equivalent to "thermal process".

As used herein, a "semiconductor structure" is an intermediate or final structure in the fabrication flow for a semiconductor device (e.g., an integrated circuit, or a discrete device such as a transistor). An example of a semiconductor structure is a silicon wafer used to fabricate a CMOS integrated circuit, the silicon wafer having on it one or more a partially or fully formed transistors. As used herein, a "cavity" in a semiconductor structure is a hole, a trench, or a gap. As used herein, a cavity has a depth, measured in a direction perpendicular to the plane of the wafer or substrate. If, in a plan view, the edge of the cavity is a convex shape, then the cavity also has a "length" (the largest transverse dimension of the cavity) and a "width" (the longest dimension in a direction perpendicular to the length). For an elliptical cavity, for example, the length is the major axis of the ellipse and the width is the minor axis of the ellipse. Cavities filled using embodiments of the present invention may include cavities in which STI structures are formed, and may have widths of 40 nm or less, 30 nm or less, or 20 nm or less. In some embodiments, the trenches filled may be more than about 100 nm deep; and in some embodiments, they may be about 200 nm or more than about 200 nm deep.

Figure 1B:
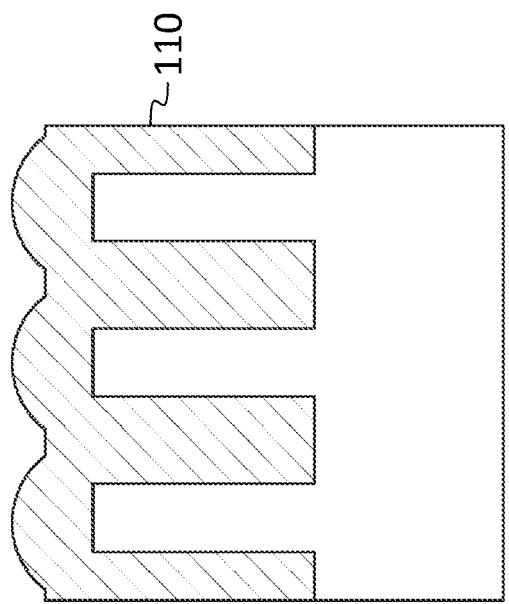
Figure 1C:
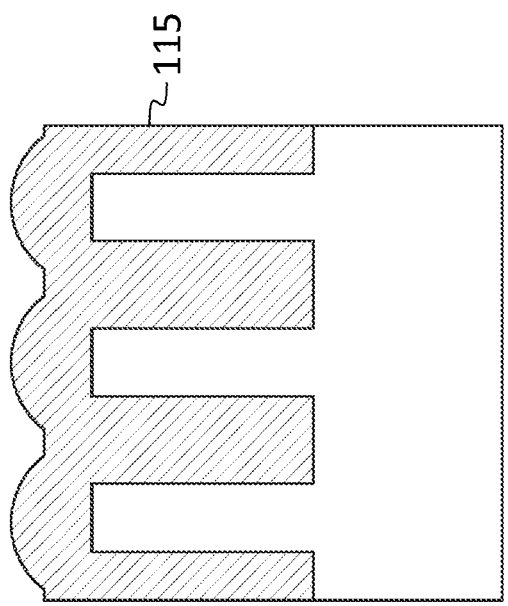
Figure 1D:
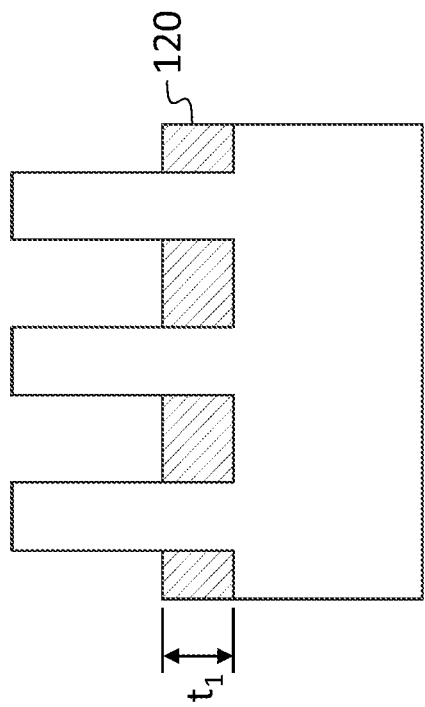

In a first exemplary embodiment, a structure to be filled (FIG. 1A) may include one or more high aspect ratio trenches 105. A first polysilazane coating 110 is formed on the structure (e.g., it is spun on to the structure) (FIG. 1B) and subjected to a thermal process to form a first layer 115 of SiO2, illustrated in FIG. 1C. The thermal process may be one that results in high density SiO2. The first layer 115 of SiO2 may then be etched back to form a first reduced layer 120 of SiO2, illustrated in FIG. 1D. The second thermal process is omitted in the first cycle, and in this embodiment, the etch-back step completes the first cycle. The thickness $t_1$ of the first reduced layer 120 may be between 5 and 50 nm, or, in some embodiments, between 5 and 25 nm. Each further cycle after the first cycle may increase the thickness of the layer formed (during that cycle and the preceding cycles) by between 5 and 50 nm, or, in some embodiments, by between 5 and 25 nm.

Figure 1E:
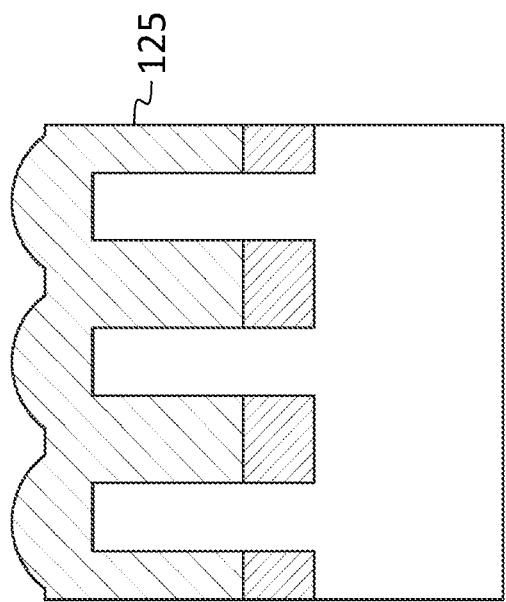
Figure 1F:
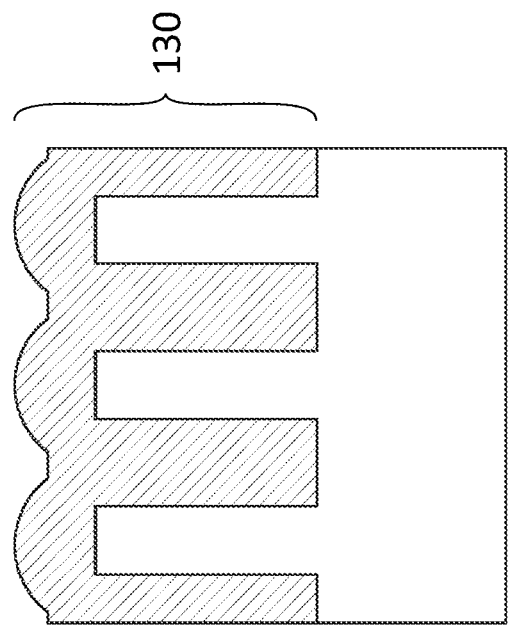
Figure 1G:
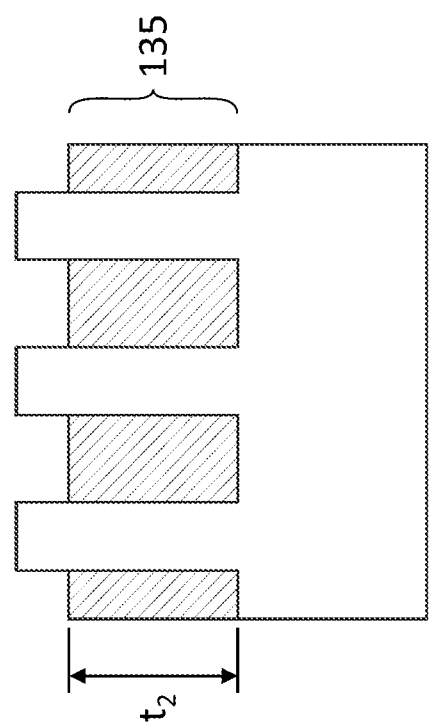

In a second cycle, a second polysilazane coating 125 is formed on the structure (e.g., it is spun on to the structure) (FIG. 1E) and subjected to a thermal process to form a second layer 130 of SiO2, illustrated in FIG. 1F, which may also be composed of high density SiO2. The newly formed portion of the second layer 130 of SiO2 may be substantially identical (e.g., in composition and density) to the first reduced layer 120 of SiO2, so that the second layer 130 of SiO2 may be a continuous, uniform structure. The second layer 130 of SiO2 may then be etched back to form a second reduced layer 135 of SiO2, illustrated in FIG. 1G. The second reduced layer 135 of SiO2 may also be a continuous, uniform structure. The second thermal process is omitted in the second cycle, and the etch-back step completes the second cycle. The thickness $t_2$ of the second reduced layer 135 may exceed the thickness $t_1$ of the first reduced layer by between 5 and 50 nm, or, in some embodiments, between 5 and 25 nm.

Figure 1H:
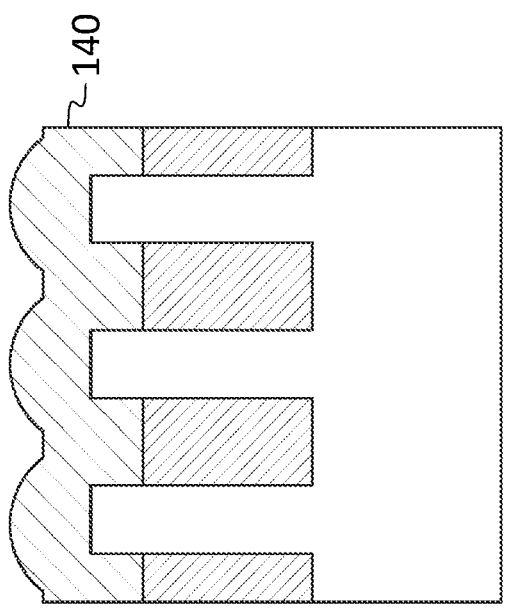
Figure 11:
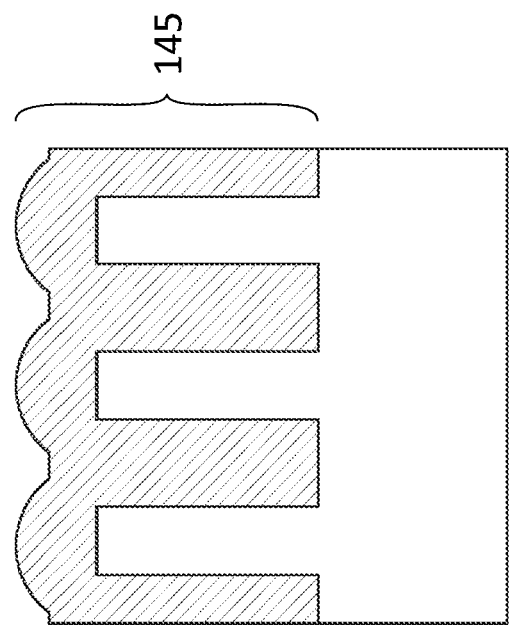

In a third cycle, a third polysilazane coating 140 is formed on the structure (e.g., it is spun on to the structure) (FIG. 1H) and subjected to a thermal process to form a third layer 145 of SiO2, illustrated in FIG. 1I, which may also be composed of high density SiO2. The newly formed portion of the third layer 145 of SiO2 may be substantially identical (e.g., in composition and density) to the second reduced layer 135 of SiO2, so that the third layer 145 of SiO2 may be a continuous, uniform structure. In this embodiment, the second thermal process is omitted in the third cycle, and in this embodiment, the first thermal process of the third cycle completes the third cycle and completes the filling process.

Figure 2A:
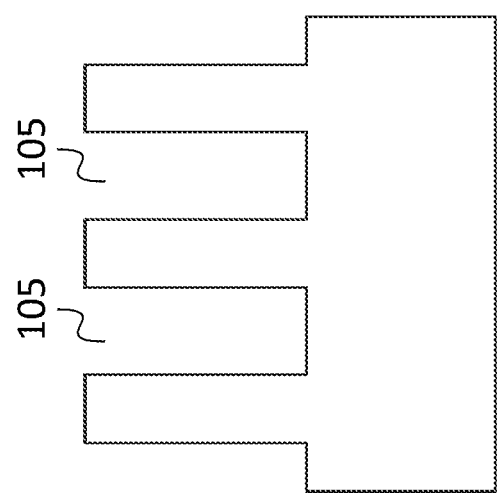
FIGS. 2A-2J are schematic cross sectional views of an intermediate structure during the fabrication of an integrated circuit according to an embodiment of the present invention.
Figure 2B:
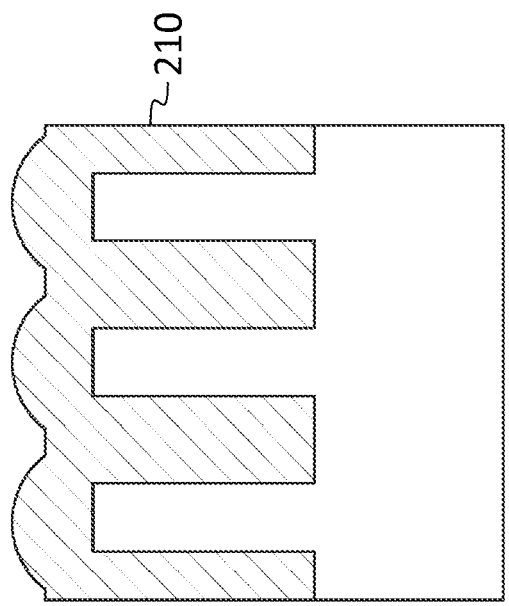
Figure 2C:
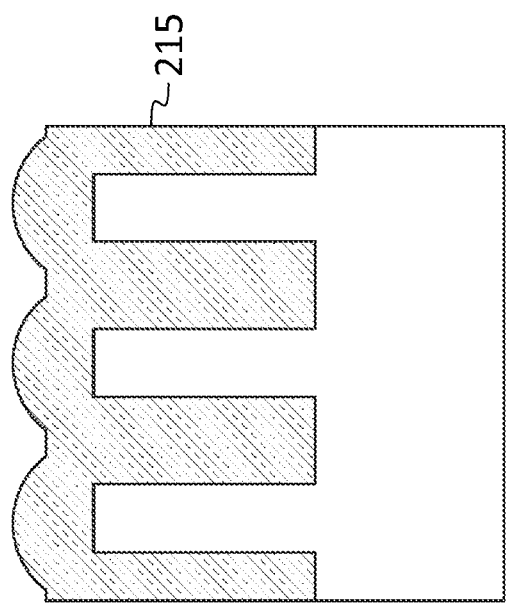
Figure 2D:
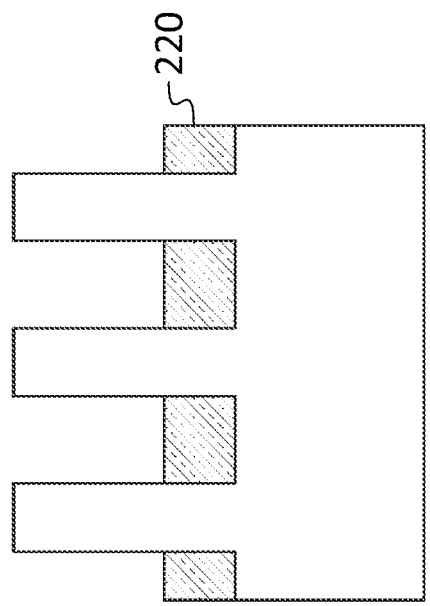

In a second exemplary embodiment, a structure to be filled (FIG. 2A) may include one or more high aspect ratio trenches 105. A first polysilazane coating 210 is formed on the structure (e.g., it is spun on to the structure) (FIG. 2B) and subjected to a thermal process to form a first layer 215 of SiO2, illustrated in FIG. 2C. The thermal process may be one that results in low density SiO2. The first layer 215 of SiO2 may then be etched back to form a first reduced layer 220 of SiO2, illustrated in FIG. 2D. In this embodiment, the second thermal process is omitted in the first cycle, and in this embodiment, the etch-back step completes the first cycle.

Figure 2E:
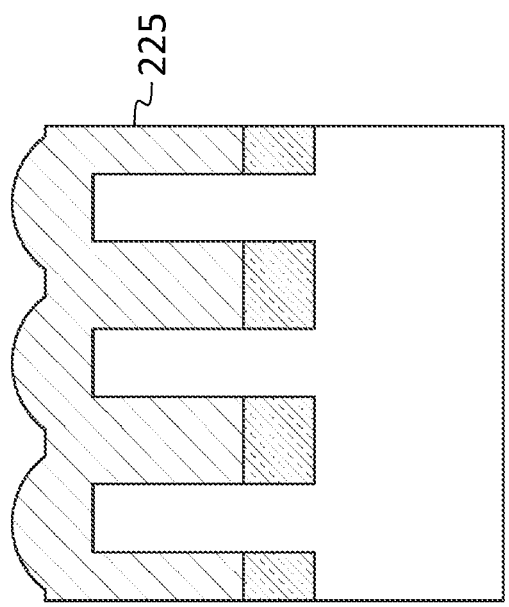
Figure 2F:
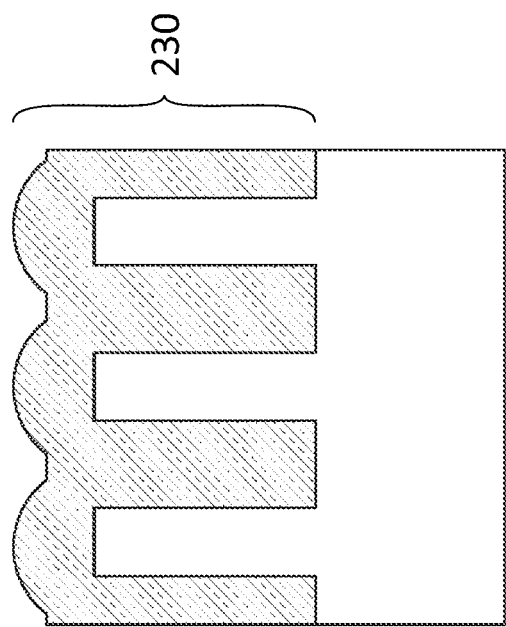
Figure 2G:
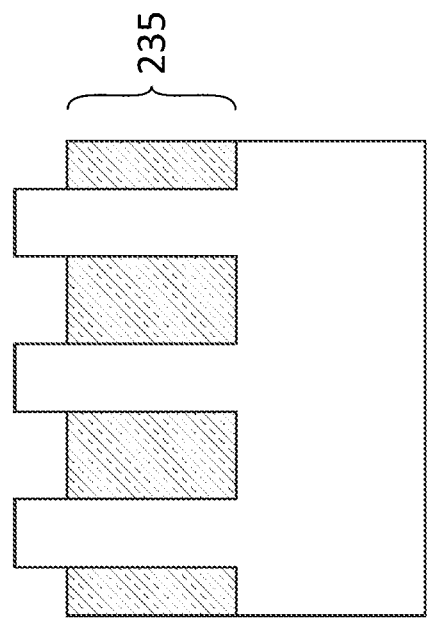

In a second cycle, a second polysilazane coating 225 is formed on the structure (e.g., it is spun on to the structure) (FIG. 2E) and subjected to a thermal process to form a second layer 230 of SiO2, illustrated in FIG. 2F, which may also be composed of low density SiO2. The newly formed portion of the second layer 230 of SiO2 may be substantially identical (e.g., in composition and density) to the first reduced layer 220 of SiO2, so that the second layer 230 of SiO2 may be a continuous, uniform structure. The second layer 230 of SiO2 may then be etched back to form a second reduced layer 235 of SiO2, illustrated in FIG. 2G. The second reduced layer 235 of SiO2 may also be a continuous, uniform structure. The second thermal process is omitted in the second cycle, and the etch-back step completes the second cycle.

Figure 2H:
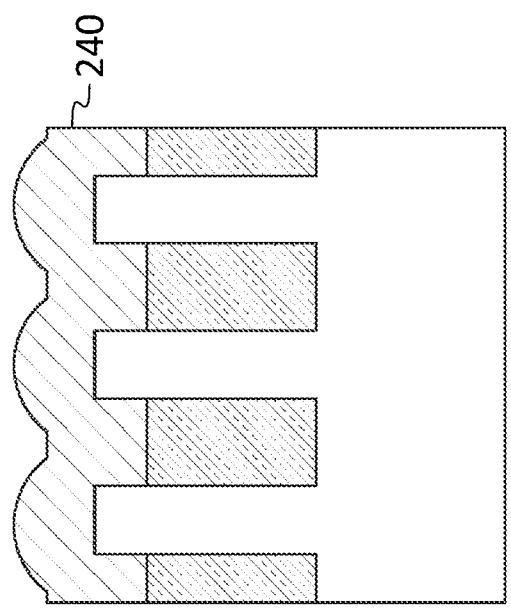
Figure 2I:
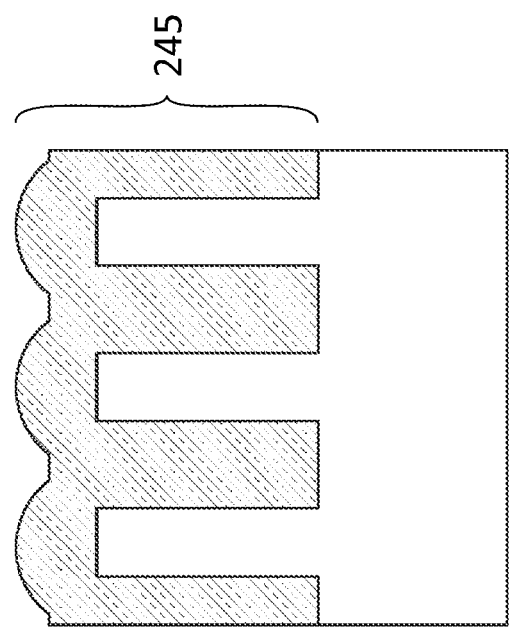
Figure 2J:
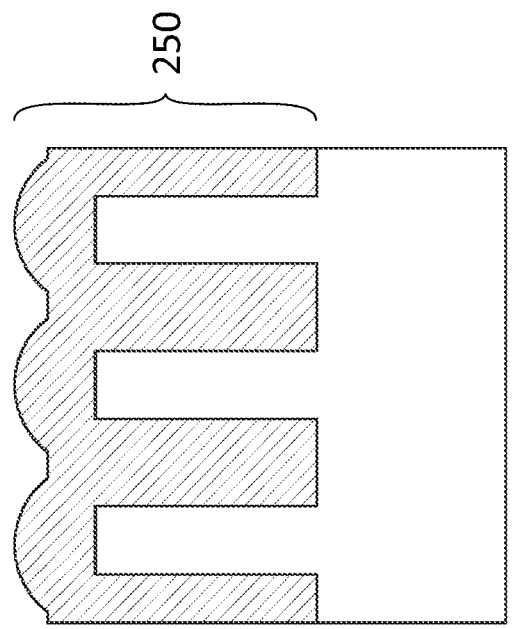

In a third cycle, a third polysilazane coating 240 is formed on the structure (e.g., it is spun on to the structure) (FIG. 2H) and subjected to a thermal process to form a third layer 245 of SiO2, illustrated in FIG. 2I, which may also be composed of low density SiO2. The newly formed portion of the third layer 245 of SiO2 may be substantially identical (e.g., in composition and density) to the second reduced layer 235 of SiO2, so that the third layer 245 of SiO2 may be a continuous, uniform structure. The third layer 245 of SiO2 is then subjected to a second thermal process (or, equivalently, the first thermal process of the third cycle is continued) to increase the density of the SiO2 in this layer, forming a continuous, uniform layer 250 of high density SiO2 (FIG. 2J).

Figure 3A:
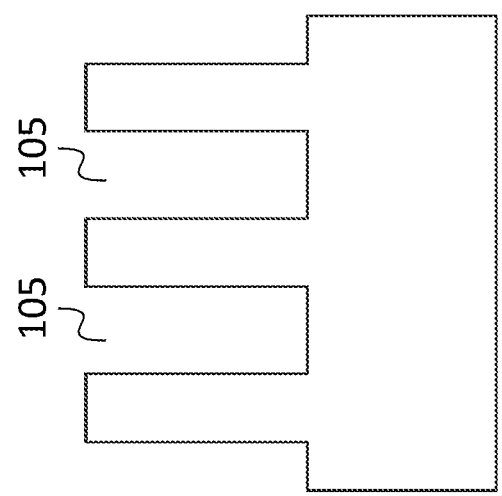
FIGS. 3A-3L are schematic cross sectional views of an intermediate structure during the fabrication of an integrated circuit according to an embodiment of the present invention.
Figure 3B:
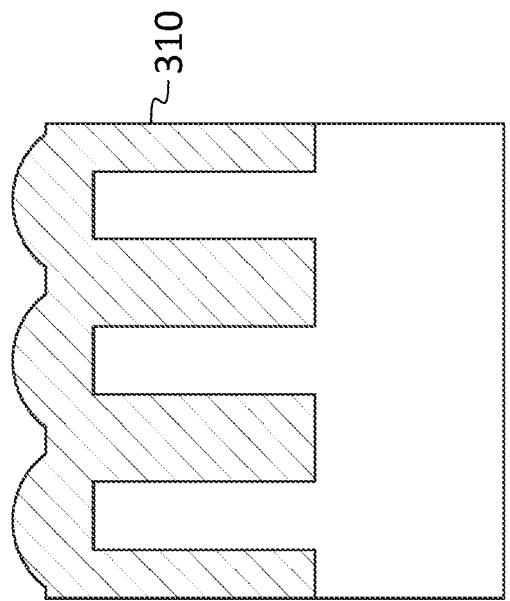
Figure 3C:
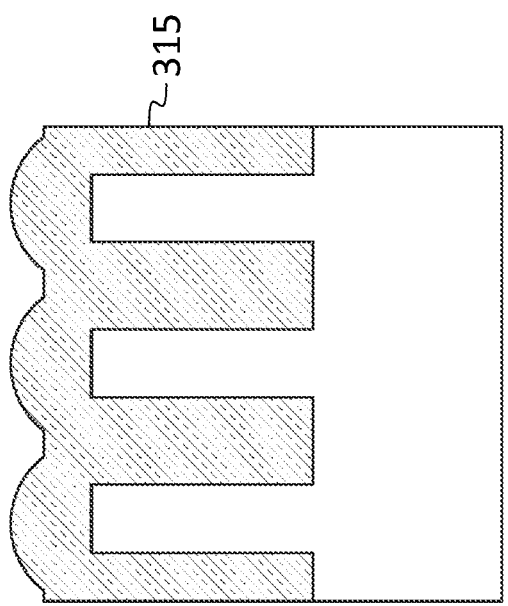
Figure 3D:
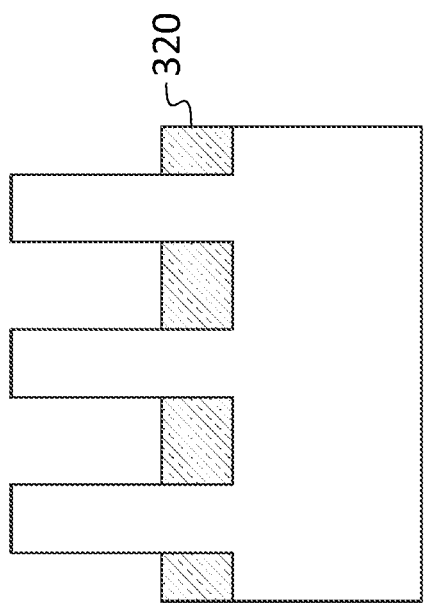
Figure 3E:
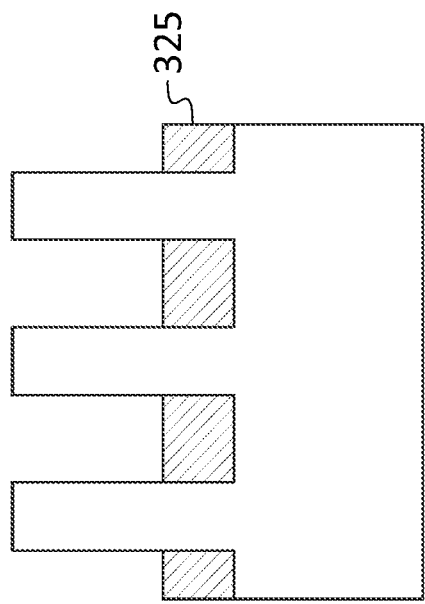

In a third exemplary embodiment, a structure to be filled (FIG. 3A) may include one or more high aspect ratio trenches 105. A first polysilazane coating 310 is formed on the structure (e.g., it is spun on to the structure) (FIG. 3B) and subjected to a thermal process to form a first layer 315 of SiO2, illustrated in FIG. 3C. The thermal process may be one that results in low density SiO2. The first layer 315 of SiO2 may then be etched back to form a first reduced layer 320 of SiO2, illustrated in FIG. 3D. A second thermal process is performed in the first cycle, to increase the density of the first reduced layer 320, forming a first high-density SiO2 layer 325; this second thermal process completes the first cycle.

Figure 3F:
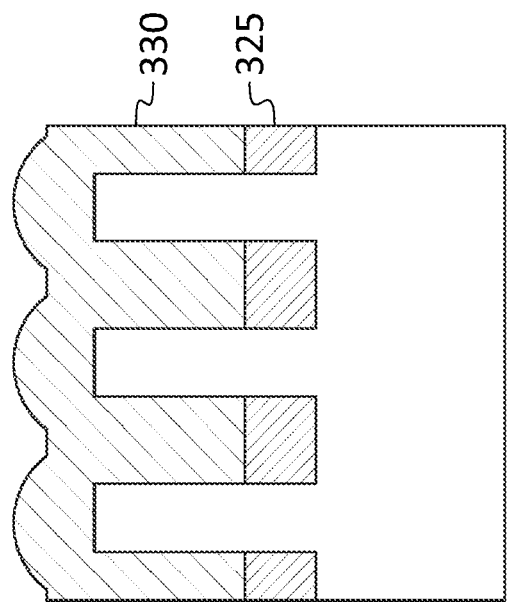
Figure 3G:
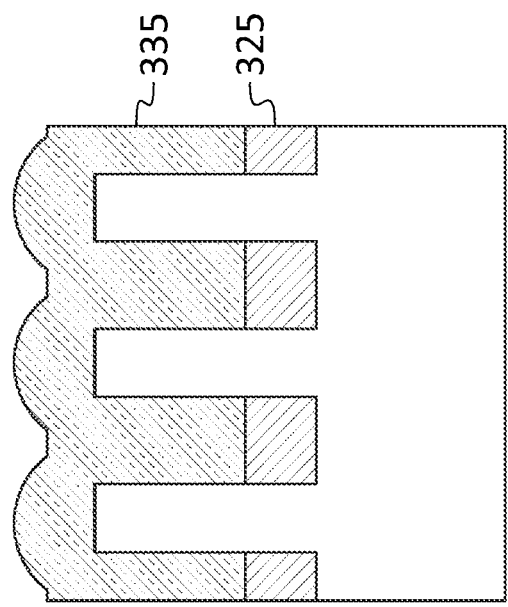
Figure 3H:
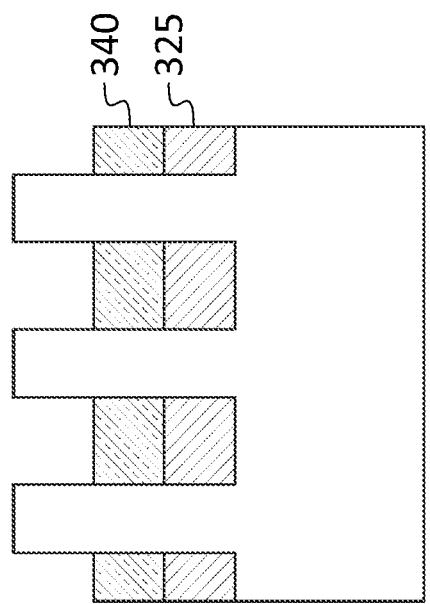
Figure 3I:
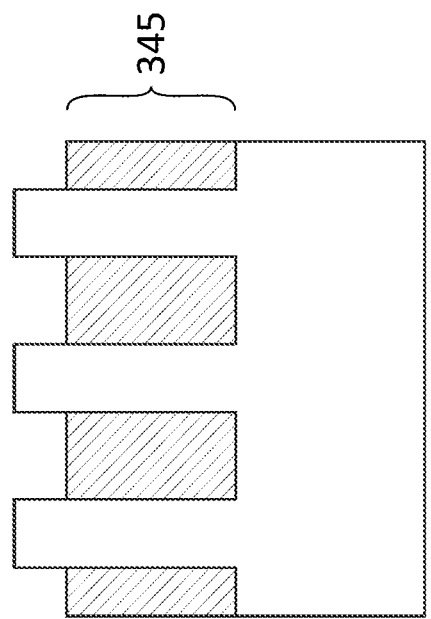

In a second cycle, a second polysilazane coating 330 is formed on the structure (e.g., it is spun on to the structure) (FIG. 3F) and subjected to a thermal process to form a second layer 335 of SiO2, illustrated in FIG. 3G, which may also be composed of low density SiO2. The second layer 335 of SiO2 may then be etched back to form a second reduced layer 340 of low density SiO2, illustrated in FIG. 3H. A second thermal process is performed in the second cycle, to increase the density of the second reduced layer 340, so that its composition and density become substantially the same as those of the first high-density SiO2 layer 325, and the two components together (the first high-density SiO2 layer 325, and the second reduced layer 340, with density increased by the second thermal process of the second cycle) form a single high-density SiO2 layer 345 (FIG. 3I), which is a continuous, uniform structure.

Figure 3J:
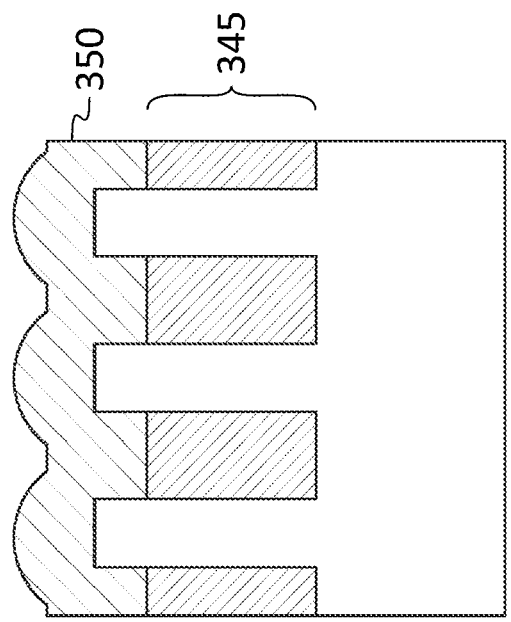
Figure 3K:
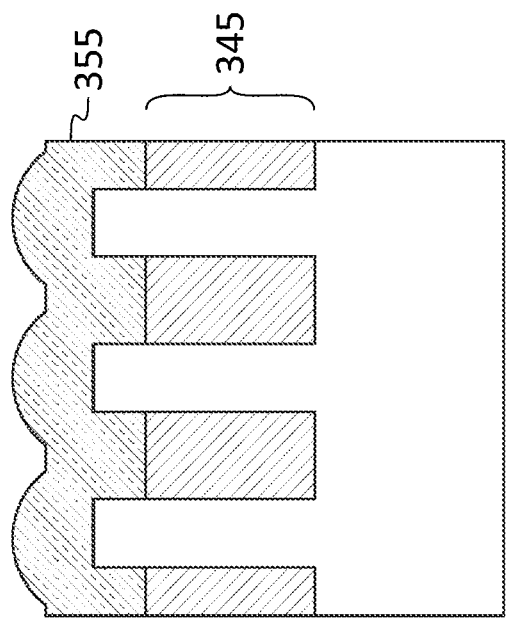
Figure 3L:
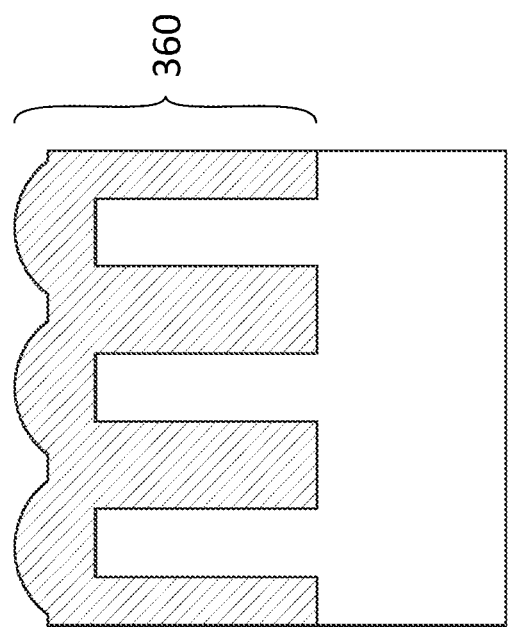

In a third cycle, a third polysilazane coating 350 is formed on the structure e.g., it is spun on to the structure) (FIG. 3J) and subjected to a thermal process to form a third layer 355 of SiO2, illustrated in FIG. 3K, which may also be composed of low density SiO2. The third layer 355 of SiO2 is then subjected to a second thermal process (or, equivalently, the first thermal process of the third cycle is continued) to increase the density of the SiO2 in this layer, so that its composition and density become substantially the same as those of the high-density SiO2 layer 345 formed during the second cycle, and the two components together (the high-density SiO2 layer 345 formed during the second cycle, and the third layer 355 of SiO2, with density increased by the second thermal process of the third cycle) form a single continuous, uniform, high-density SiO2 layer 360 (FIG. 3L).

In some embodiments the thickness of filling material added in each cycle (as measured vertically in the schematics drawings shown) is of about 5 to 50 nm, or, in some embodiments, between 5 and 30 nm. As mentioned above, ambients may include wet oxidation or dry oxidation environments for example.

When two thermal processes are employed to first create low density SiO2 and, second, to subsequently increase the density of the low density SiO2 to form high density SiO2, the first of these thermal processes may include an initial slow ramp and may include soak steps at temperatures ranging from 100° C. to 250° C. and subsequent steps at higher temperatures ranging from 500° C. to 850° C. This first thermal processing step may result in the release of byproducts from the film. In some embodiments, the film is substantially comprised of SiO2 after such a first thermal processing step. The second thermal processing step may include further densification of the film at temperatures ranging from 500° C. to 850° C., so that the film is composed of good quality, high density SiO2 after these steps. The increase in density produced by a higher temperature thermal process may be an increase of about 20% or more. Densification may occur gradually at higher temperatures; accordingly the density of the film after the first thermal processing step may depend on the amount of time spent at higher temperatures in that thermal processing step.

An indication of Si—O bond density is the area of the Si—O peak (having a wave number of about 1050–1100 cm$^{-1}$) obtained in Fourier-Transform Infra-Red (FTIR) spectroscopy. As a film's Si—O bond density increases, the intensity of this peak increases. Comparisons of Si—O FTIR intensities for films of similar thicknesses give a measure of relative Si—O bond densities. State of the art oxidation processes may be considered to achieve optimized high density SiO2 films from polysilazane coatings, and used as references to the Si—O bond density. Otherwise, a high quality SiO$_2$ layer, e.g. with a density of about 2.2. g/cm$^3$, may be used as a reference of a high density SiO$_2$ film (for example, an SiO$_2$ film thermally grown on Si).

In some embodiments, the final film (i.e., the fill material formed in the cavity at the end of the final cycle) is an SiO2 layer with a uniform Si—O density throughout the thickness of the film, with this density being characterized by a relative Si—O bond density compared to state of the art films or high density films of at least 80%. The non-uniformity (NU), throughout the film thickness, of the Si—O bond density may be less than 20% (1 sigma).

The non-uniformity of the Si—O bond density may be measured in a similar way by FTIR, e.g., by comparing films of different thicknesses (FTIR peak intensities normalized to film thickness), or by comparing densities before and after an etch-back (FTIR peak intensities normalized to film thickness, with thicknesses calibrated, e.g., by transmission-electron microscopy). Other ways of measuring Si—O bond density are possible.

Although the final fill material is described in some embodiments as being silicon dioxide, in some embodiments it may include other forms of silicon oxide (e.g., silicon monoxide) or other oxides, or other materials that are not oxides.

In view of the foregoing, some embodiments provide a method of filling cavities in a semiconductor structure during fabrication. A layer of a first material, e.g., a polysilazane, is deposited on the semiconductor, and subjected to a first thermal process to change its chemical composition, e.g., to change it to silicon oxide (e.g., silicon dioxide, or silicon monoxide, or silicon trioxide). It is then etched back, and the cycle of deposition, and thermal processing is repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," "used," and "step" may be considered synonymous with the terms "utilize," "utilizing," "utilized," and "act" respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an improved method for filling have been specifically described and illustrated herein, many modifications and variations will be apparent to those skilled in the art. Accordingly, it is to be understood that an improved method for filling constructed according to principles of this invention may be embodied other than as specifically described herein. The invention is also defined in the following claims, and equivalents thereof.

What is claimed is:

1. A method for filling a cavity in a semiconductor structure, the method comprising:
    forming a first layer of a first material in the cavity;
    subjecting the semiconductor structure to a first thermal process including subjecting the semiconductor structure to a temperature of at least 100° C. for interval of time;
    etching back the first layer to form a reduced first layer, having a reduced thickness;
    forming a second layer of a second material, in the cavity; and
    subjecting the semiconductor structure to a second thermal process including subjecting the semiconductor structure to a temperature of at least 100° C. for interval of time, to form, from at least the reduced first layer and the second layer, a single layer of uniform composition and density.

2. The method of claim 1, wherein the second material is the same as the first material.

3. The method of claim 2, wherein the first material is a polysilazane.

4. The method of claim 2, wherein the forming of the second layer of the second material is performed by substantially the same process as the forming of the first layer of the first material, and wherein the second thermal process is substantially the same as the first thermal process.

5. The method of claim 1, wherein the forming of the second layer of the second material, in the cavity, comprises forming the second layer directly on the reduced first layer.

6. The method of claim 1, wherein the second thermal process is substantially the same as the first thermal process, the method further comprising:
    performing a third thermal process after performing the second thermal process,
    the third thermal process increasing the density of the single layer by at least about 20%.

7. The method of claim 6, wherein
    the forming of the first layer comprises forming the first layer by a spin-on deposition, and/or
    the forming of the second layer comprises forming the second layer by a spin-on deposition.

8. The method of claim 7, wherein the single layer substantially fills the cavity.

9. The method of claim 1, wherein the first material and/or the second material comprises, as a major component, an inorganic polysilazane.

10. The method of claim 9, wherein:
    the first material comprises, as a major component, an inorganic polysilazane, and, after the subjecting of the semiconductor structure to the first thermal process, the first layer comprises, as a major component, silicon dioxide, and/or the second material comprises, as a major component, an inorganic polysilazane, and, after the subjecting of the semiconductor structure to the second thermal process, the second layer comprises, as a major component, silicon dioxide.

11. The method of claim 9, wherein:

the subjecting of the semiconductor structure to the first thermal process comprises subjecting the semiconductor structure to the first thermal process in a wet oxidation environment, and/or the subjecting of the semiconductor structure to the second thermal process comprises subjecting the semiconductor structure to the second thermal process in a wet oxidation environment.

12. The method of claim 1, wherein the first thermal process includes subjecting the semiconductor structure to a temperature between 100° C. and 250° C. for an interval of time, and the second thermal process includes subjecting the semiconductor structure to a temperature between 500° C. and 850° C. for an interval of time.

13. The method of claim 1, wherein the cavity is a trench for a shallow trench isolation (STI) structure.

14. The method of claim 1, wherein the single layer comprises, as a major component, an oxide.

15. The method of claim 1, wherein a width of the cavity is less than 40 nm.

16. The method of claim 1, wherein a width of the cavity is less than 20 nm.

17. The method of claim 1, further comprising:

etching back the single layer to form a reduced single layer, having a reduced thickness, wherein a thickness of the reduced first layer is greater than 5 nm and less than 50 nm, and a thickness of the reduced single layer is greater than 10 nm and less than 100 nm.

18. A method for filling a cavity in a semiconductor structure, the method comprising:

forming a first layer of a first material in the cavity;

subjecting the semiconductor structure to a first thermal process including subjecting the semiconductor structure to a temperature of at least 100° C. for interval of time, to form, from the first layer, a second layer of a second material having a chemical composition different from that of the first material;

etching back the second layer to form a reduced second layer, having a reduced thickness;

forming a third layer of a third material, in the cavity; and subjecting the semiconductor structure to a second thermal process including subjecting the semiconductor structure to a temperature of at least 100° C. for interval of time, to form from at least the reduced second layer and the third layer, a single layer of uniform composition and density.

19. The method of claim 18, wherein the second thermal process increases the density of the second material by at least about 20%.

20. A method for filling a cavity in a semiconductor structure, the method comprising:

forming a first layer of a first material in the cavity;

subjecting the semiconductor structure to a first thermal process including subjecting the semiconductor structure to a temperature of at least 100° C. for interval of time, to form, from the first layer, a second layer of a second material having a chemical composition different from that of the first material;

etching back the second layer to form a reduced second layer, having a reduced thickness;

forming a third layer of the first material, in the cavity; and subjecting the semiconductor structure to a second thermal process including an subjecting the semiconductor structure to a temperature of at least 100° C. for interval of time, to form from at least the reduced second layer and the third layer, a single layer, of uniform composition and density, of the second material.

* * * * *